(12) United States Patent
Nayak

(10) Patent No.: US 9,406,799 B2
(45) Date of Patent: Aug. 2, 2016

(54) HIGH MOBILITY PMOS AND NMOS DEVICES HAVING SI—GE QUANTUM WELLS

(71) Applicant: GLOBALFOUNDRIES Inc., Grand Cayman (KY)

(72) Inventor: Deepak Kumar Nayak, Fremont, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/519,709

(22) Filed: Oct. 21, 2014

(65) Prior Publication Data

US 2016/0111539 A1    Apr. 21, 2016

(51) Int. Cl.

| | |
|---|---|
| H01L 29/78 | (2006.01) |
| H01L 29/66 | (2006.01) |
| H01L 29/12 | (2006.01) |
| H01L 27/092 | (2006.01) |
| H01L 29/165 | (2006.01) |
| H01L 21/8238 | (2006.01) |
| H01L 21/02 | (2006.01) |

(52) U.S. Cl.
CPC ...... *H01L 29/7849* (2013.01); *H01L 21/02532* (2013.01); *H01L 21/823807* (2013.01); *H01L 21/823821* (2013.01); *H01L 27/092* (2013.01); *H01L 27/0924* (2013.01); *H01L 29/122* (2013.01); *H01L 29/165* (2013.01); *H01L 29/66477* (2013.01)

(58) Field of Classification Search
None
See application file for complete search history.

(56) References Cited

U.S. PATENT DOCUMENTS

| | | | | |
|---|---|---|---|---|
| 6,897,471 | B1* | 5/2005 | Soref | B82Y 20/00 257/14 |
| 2011/0180854 | A1* | 7/2011 | Ramdani | H01L 29/225 257/194 |

OTHER PUBLICATIONS

Kuo et al. ("Quantum-Confined Stark Effect in Ge/SiGe Quantum Wells on Si for Optical Modulator", IEEE J. of Selected Topics in Quantum Electronics, vol. 12, No. 6, pp. 1503-1513, Nov./Dec. 2006).*

* cited by examiner

*Primary Examiner* — Yasser A Abdelaziez
(74) *Attorney, Agent, or Firm* — Williams Morgan, P.C.

(57) ABSTRACT

At least one method, apparatus and system disclosed involves semiconductor base structure adapted for accepting at least one of a NMOS device and a PMOS device. A substrate is formed. A strained relaxed layer is formed on the substrate. A first tensile strained layer is formed on the strained relaxed layer. A first compressive strain layer is formed on the first tensile strained layer.

19 Claims, 7 Drawing Sheets

HIGH MOBILITY PMOS AND NMOS DEVICES HAVING SI—GE QUANTUM WELLS

FIELD OF THE INVENTION

Generally, the present disclosure relates to the manufacture of sophisticated semiconductor devices, and, more specifically, to fabricating high mobility PMOS and NMOS devices using Si—Ge quantum wells.

DESCRIPTION OF THE RELATED ART

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a plurality of process technologies are currently practiced, wherein, for many types of complex circuitry, including field effect transistors, MOS technology is currently among the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. During fabrication of N-channel MOS (NMOS) devices and/or P-channel MOS (PMOS) devices, designers often control process steps to allow for increase current drive of those devices. For NMOS devices, the flow of electrons may be enhanced for increased current drive. For PMOS devices, the flow of "holes" may be enhanced for increased current drive. For example, a strained silicon layer is often formed to provide for improved transport of charge particles (i.e., electrons or holes).

FIG. 1 illustrates a stylized cross-sectional view of a prior art base structure for forming an NMOS device. A silicon substrate layer 110 is formed, upon which a strained relaxed buffer (SRB) layer 120 may be formed. A strained silicon layer (i.e., strained channel material layer) 130 is then formed on the SRB layer 120. For an NMOS device, the strain is directed to a tensile strain. The buffer layer 120 is required to be strain relaxed in order to allow the formation of a strained silicon layer 130. The tensile strained silicon layer 130 provides for enhanced transport of electrons, thereby enhancing the current drive of the NMOS device.

A strained silicon layer may be achieved by controlling the silicon (Si) and germanium (Ge) concentrations in a SiGe layer. The lattice constant of the SiGe layer may be controlled by adjusting the germanium concentration. The thickness of the SRB layer 120 is higher than that of the silicon substrate layer 110. The strained relaxed buffer 120 of FIG. 1 may be about 1 micron (um) to about 5 um. The concentration of the silicon germanium material in the SRB layer 120 may be expressed as $Si_{(1-x)}Ge_{(x)}$, wherein x has a value between 0 and 1. For example, the strained relaxed buffer 120 may have a silicon germanium concentration of $SiO_{0.5}Ge_{0.5}$, where x=0.5. The lattice constant of the strained relaxed buffer 120 is greater than the lattice constant of the silicon substrate layer 110.

A strained channel material layer 130 is formed on the strained relaxed buffer 120. The thickness of the channel material layer 130 may be about 60 Angstrom (A) to 150 A. The channel material layer 130 may be a silicon channel layer or a combination of silicon and germanium layer. The concentration of the silicon and germanium of the channel material layer 130 may expressed as $Si_{(1-y)}Ge_{(y)}$, where "y" is less than "x". For example, the concentration of the silicon germanium material in the strained channel material layer 130 may be $Si_{0.7}Ge_{0.3}$, where "y" is equal to 0.3. The top channel layer 130 is formed to have a biaxial tensile strain. The electron mobility in the channel material layer 130 is higher than that of the silicon substrate 110.

Similarly, a base structure to form PMOS devices may also be fabricated. FIG. 2 illustrates a stylized cross-sectional view of a prior art base structure for forming a PMOS device. A silicon substrate layer 210 is formed, upon which a strained relaxed buffer (SRB) layer 220 may be formed. The buffer layer 220 is required to be strain relaxed in order to allow the formation of a strained silicon layer 230. A strained silicon layer (i.e., strained channel material layer) 230 is then formed on the SRB layer 220. For forming a PMOS device, the strain is directed to a compressive strain. The compressive strained silicon layer 230 provides for enhanced transport of holes.

As noted above, the lattice constant of the SiGe layer may be controlled by adjusting the germanium concentration. The lattice constant of the SRB layer 220 is higher than that of the silicon substrate layer 210. The strained relaxed buffer 220 of FIG. 2 may be 1 um to 5 um. For example, the strained relaxed buffer 220 may have a silicon germanium concentration of $SiO_{0.5}Ge_{0.5}$, where x=0.5. The lattice constant of the strained relaxed buffer 220 is greater than the lattice constant of the silicon substrate layer 210.

A strained channel material layer 230 is formed on the strained relaxed buffer 220. The thickness of the channel material may be about 60 A to 150 A. The channel material layer 230 may be a germanium channel layer of a combination of silicon and germanium layer. The concentration of the silicon and germanium of the channel material layer 130 may expressed as $Si_{(1-z)}Ge_{(z)}$, where "z" is greater than "x". For example, the concentration of the silicon germanium material in the strained channel material layer 230 may be $Si_{0.3}Ge_{0.7}$, where "z" is equal to 0.7. The top channel layer 230 is formed to have a biaxial compressive strain. The hole mobility in the channel material layer 230 is higher than that of the silicon substrate 210.

The base structures described above are generally formed separately in different processes. The base structures are then integrated for forming NMOS and PMOS devices. This separate manufacturing of the base structures may be time-consuming, inefficient and costly.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a semiconductor base structure adapted for accepting at least one of a NMOS device and a PMOS device. A substrate is formed. A strained relaxed layer is formed on the substrate. A first tensile strained layer is formed on the strained relaxed layer. A first compressive strain layer is formed on the first tensile strained layer.

BRIEF DESCRIPTION OF THE DRAWINGS

The disclosure may be understood by reference to the following description taken in conjunction with the accompanying drawings, in which like reference numerals identify like elements, and in which.

Figure 1:
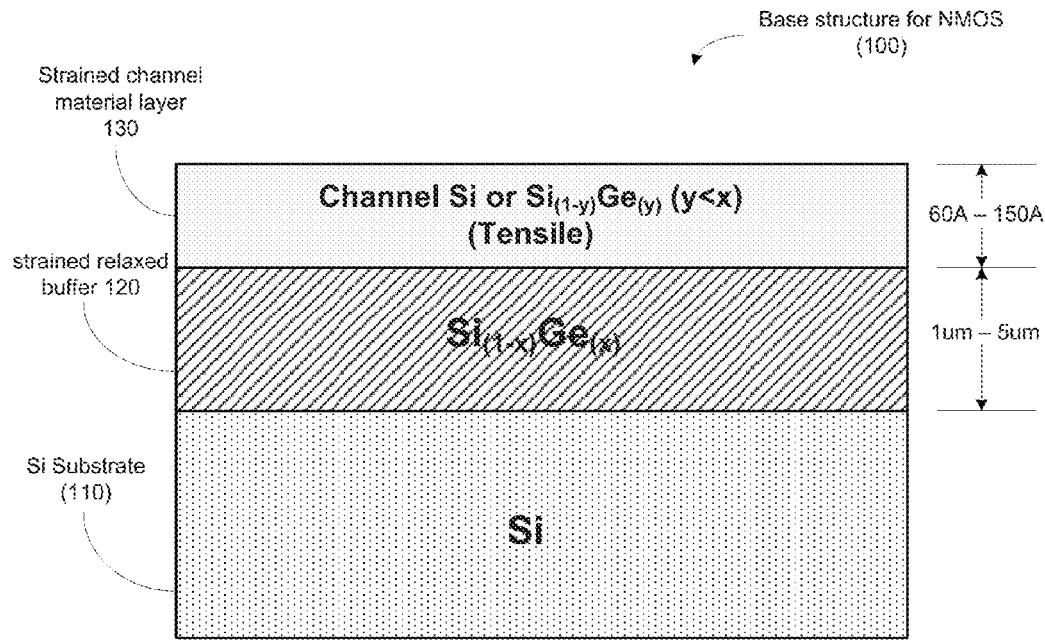
FIG. 1 illustrates a stylized cross-sectional view of a prior art base structure for forming an NMOS device.
Figure 2:
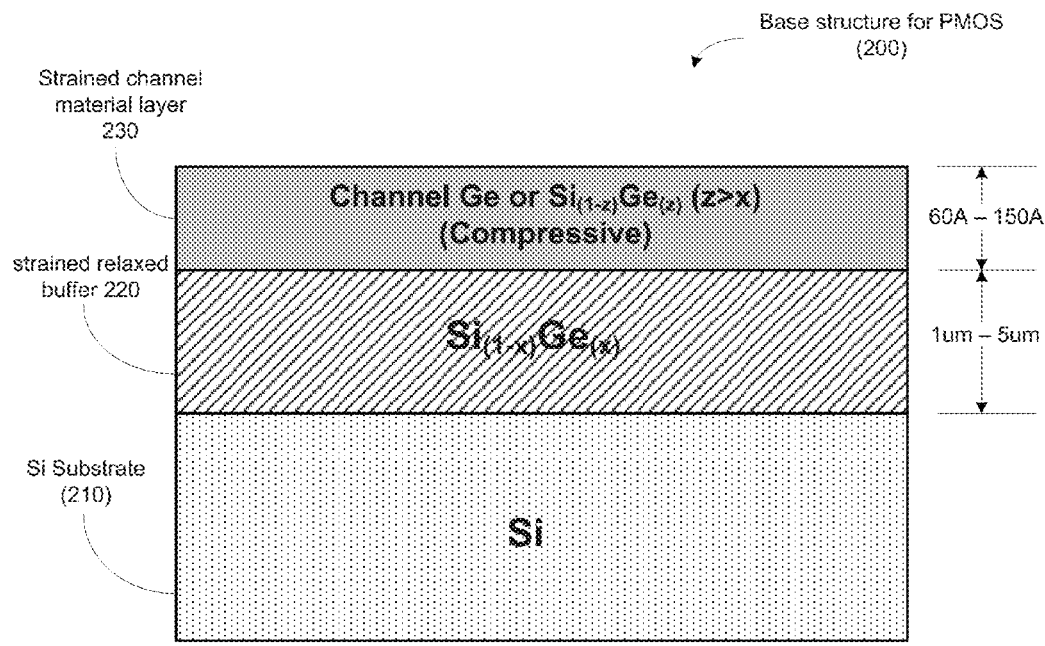
FIG. 2 illustrates a stylized cross-sectional view of a prior art base structure for forming a PMOS device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for fabricating a semiconductor base structure for forming NMOS and/or PMOS devices, e.g., transistors. A plurality of quantum wells may be formed on a semiconductor base structure such that mobility of electrons and/or holes are enhanced. Therefore, NMOS and/or PMOS devices may be formed upon the semiconductor base structure. In some embodiments, alternating thin layers of silicon-heavy material channel layers and germanium-heavy material channel layers may be formed to fabricate an alternating quantum wells group that provide increased mobility for electrons and holes. This enables the semiconductor base structure to accept fabrication of NMOS and/or PMOS devices.

Moreover, the quantum wells provided by the alternating layers described herein provide for high current drive for NMOS and PMOS devices formed on a single semiconductor base structure. For example, CMOS devices (including both NMOS and/or PMOS devices) may be provided with enhanced current drive when formed upon a single semiconductor base structure that comprises the alternating quantum wells having alternating thin layers of silicon-heavy material channel layers and germanium-heavy material channel layers. In one embodiment, the term enhanced current drive may refer to an increased current drive compared to the current drive that would be available for the PMOS and CMOS devices without the quantum wells layers described herein. Accordingly, embodiments provide for using a single stack for CMOS fabrication, wherein the CMOS fabrication may comprise both NMOS and PMOS devices that are capable of having higher current drive capabilities.

In some embodiments, if only NMOS devices, or primarily NMOS devices, are to be fabricated, the semiconductor base structure comprising the alternating quantum wells group may be formed such that the top most layer of the quantum wells group is a silicon heavy material channel thin layer. If only PMOS, or primarily PMOS devices, devices are to be fabricated, the semiconductor base structure comprising the alternating quantum wells group may be formed such that the top most layer of the quantum wells group is a germanium heavy material channel thin layer.

Further, in some embodiments, the concentration of silicon or germanium may be adjusted to provide the desired charge carrier mobility for enhancing electron mobility for NMOS devices or enhancing holes mobility for PMOS devices. The concentration of silicon or germanium may be adjusted to provide the desired amount of strain in the material channel layers. For fabricating NMOS devices, the concentrations of silicon and/or germanium are adjusted in an SiGe layer such that a net tensile strain is present in the material channel layer. For fabricating PMOS devices, the concentrations of silicon and/or germanium are adjusted in a SiGe layer such that a net compressive strain is present in the material channel layer.

Figure 3:
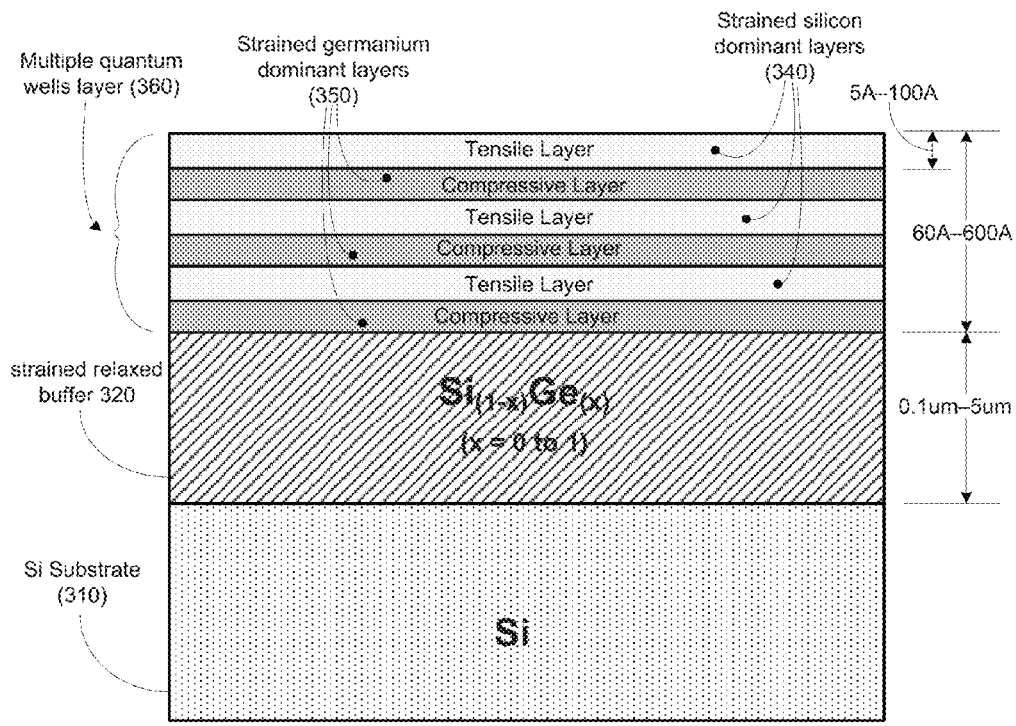
FIG. 3 illustrates a stylized cross-sectional depiction of a base substrate, in accordance with a first embodiment herein.

Turning now to FIG. 3, a stylized cross-sectional depiction of a base substrate, in accordance with embodiments herein, is illustrated. A silicon substrate layer 310 (bulk silicon layer) may be formed as a base layer. A strained relaxed buffer (SRB) layer 320 may be formed on the silicon substrate layer 310. In one embodiment, the straining of a silicon layer may be achieved by controlling the silicon and germanium concentrations in an SiGe layer. The lattice constant of the SiGe layer may be controlled by adjusting the germanium concentration. The lattice constant of the SRB layer 320 may be higher than that of the silicon substrate layer 310.

In some embodiments, the thickness of the strained relaxed buffer 320 may be between about 0.1 um to 5 um. The concentration of the silicon germanium material in the SRB layer 320 may be expressed as $Si_{(1-x)}Ge_{(x)}$. For example, the strained relaxed buffer 320 may have a silicon germanium concentration of $SiO_{0.5}Ge_{0.5}$, where x=0.5. If x=0, then the concentration would be pure silicon. If x=1, the concentration would be pure Germanium. If x=0.5, the concentration of silicon and germanium would be equal. The value of x may be any number from 0 to 1. Although many example provided herein describe multiple quantum wells layer 360 described below being formed on an SRB layer, in some examples, the multiple quantum wells layer 360 may be formed on bulk silicon layer, wherein x equals to 0.

Upon the SRB layer 320, a layer comprising a plurality of quantum wells (i.e., multiple quantum wells layer 360) may be formed. The quantum wells occur as a result of alternating thin layers of compressive and tensile layers. In some embodiments, the multiple quantum wells layer may be about 60 A to about 600 A thick. The multiple quantum wells layer 360 may comprise a plurality of silicon dominant layers 340 and a plurality of germanium dominant layers 350. In some embodiments, the silicon dominant layers 340 and the thickness of germanium dominant layers 350 may each be about 5 A to 100 A.

The multiple quantum wells layer 360 may comprise a plurality of strained silicon dominant layers 340 (i.e., tensile strained channel material layer) that has a concentration of the silicon and germanium that may expressed as $Si_{(1-y)}Ge_{(y)}$, where "y" is less than "x". For example, the concentration of the silicon germanium material in the strained silicon dominant layers 340 may be $Si_{0.7}Ge_{0.3}$, where "y" is equal to 0.3 (indicating 70% silicon and 30% germanium concentrations). Each of the strained silicon dominant layers 340 is formed to have a biaxial tensile strain. The electron mobility in the strained silicon dominant layers 340 is higher than that of the silicon substrate 310. The biaxial tensile strain of the strained silicon dominant layers 340 provides for enhanced electron mobility, which is useful for increasing the current drive in NMOS devices.

Figure 4:
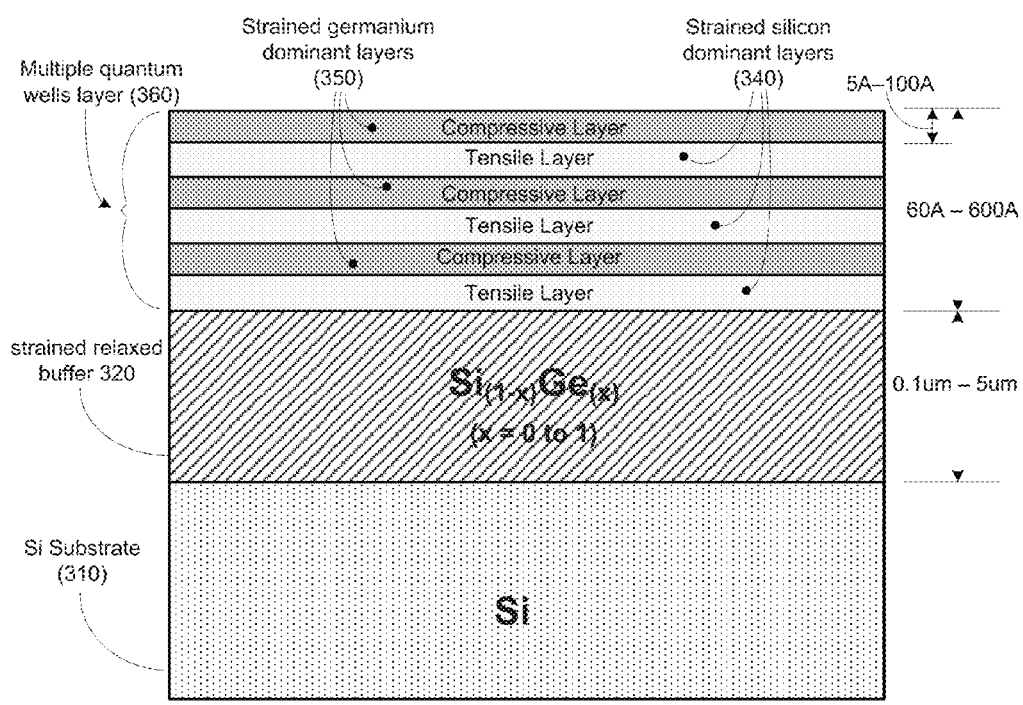
FIG. 4 illustrates a stylized cross-sectional depiction of a base substrate, in accordance with a second embodiment herein.

The strained silicon dominant layers 340 are formed in an alternating fashion, alternating with strained germanium dominant layers 350, as illustrated in FIGS. 3 and 4. The strained germanium dominant layers 350 (i.e., compressive strained channel material layer) has a concentration of the silicon and germanium that may expressed as $Si_{(1-z)}Ge_{(z)}$, where "z" is greater than "x." For example, the concentration of the silicon germanium material in the strained channel material layer 130 may be $Si_{0.3}Ge_{0.7}$, where "z" is equal to 0.7 (indicating 70% germanium and 30% silicon concentrations). The strained germanium dominant layers 350 are formed to have a biaxial compressive strain. The hole mobility in the channel material layer 350 is higher than that of the silicon substrate 310. The biaxial compressive strain of the strained silicon dominant layers 350 provides for enhanced hole mobility, which is useful for increasing the current drive in PMOS devices.

The strained silicon dominant layers 340 and strained germanium dominant layers 350 may be deposited in an alternating fashion on the strained relaxed buffer 320, until the multiple quantum wells layer 360 reaches a thickness of about 60 A to about 600 A. The alternating layers 340 and 350 in the multiple quantum wells layer 360 are strained in opposite manners, wherein tensile strain for layers 340 (silicon dominant) and compressive strain for layer 350 (germanium dominant). The opposing strains (tensile and compressive) provided by this set of alternating layers within the multiple quantum wells layer 360 may provide for improved mobility of all charge carriers in the multiple quantum wells layer 360. That is, the opposing strains in the multiple quantum wells layer 360 improve electron mobility as well as hole mobility of the multiple quantum wells layer 360 as a whole, improving the current drive of both NMOS and PMOS substantially simultaneously.

The electron mobility provided by the multiple quantum wells layer 360 affects the drain saturation current ($I_{D\_Sat\_N}$) of NMOS transistors that may be formed on the multiple quantum wells layer 360. The hole mobility provided by the multiple quantum wells layer 360 affects the drain saturation current ($I_{D\_Sat\_P}$) of PMOS transistors that may be formed on the multiple quantum wells layer 360. Moreover, the electron mobility may be independently controlled by selecting the concentrations of silicon and germanium in the strained silicon dominant layers 340 (i.e., by selecting the values for x and y of $Si_{(1-y)}Ge_{(y)}$). Similarly, the hole mobility may be independently controlled by selecting the concentrations of silicon and germanium in the strained germanium dominant layers 350 (i.e., by selecting the values for x and z of $Si_{(1-z)}Ge_{(z)}$). Therefore, by selecting the values for x, y, and z described above, the $I_{D\_Sat\_N}$ and the $I_{D\_Sat\_P}$ currents of NMOS and PMOS transistor formed on the multiple quantum wells layer 360 may be independently controlled.

As an illustrative example, the value of x may be selected to be 0.5 providing a strained-relaxed layer of roughly equal silicon and germanium concentrations at a thickness of about 150 A or greater. Further, the value of y may be selected to be 0.2 providing a relatively strong $I_{D\_Sat\_N}$ as a result of the concentration of the strained silicon dominant layer 340 being defined by $Si_{(0.8)}Ge_{(0.2)}$. In this example, the value of z may be selected to be 0.8 providing a relatively strong $I_{D\_Sat\_P}$ as a result of the concentration of the strained germanium dominant layer 350 being defined by $Si_{(0.2)}Ge_{(0.8)}$.

In one embodiment, the top layer of the multiple quantum wells layer 360 may be selected to be a strained silicon dominant layer 340, which may behave as an Si cap layer. This Si cap layer may provide a high quality interface of a gate stack for an NMOS device. FIG. 3 exemplifies a quantum wells layer 360 that has an Si cap layer.

In an alternative embodiment, the top layer of the multiple quantum wells layer 360 may be selected to be a strained germanium dominant layer 350, which may behave as an Ge cap layer. This Ge cap layer may be may provide a high quality interface of a gate stack for a PMOS device. FIG. 4, which illustrates a stylized cross-sectional depiction of a base substrate in accordance with an alternative embodiment, exemplifies a quantum wells layer 360 that has a Ge cap layer.

Further, the total thickness of the multiple quantum wells layer 360 of FIGS. 3 and 4 are formed in a manner to avoid strain relaxation similar to the strain relaxation that is provided in the strained relaxation buffer layer 320. Therefore, in some embodiments, the total thickness of the multiple quantum wells layer 360 of FIGS. 3 and 4 are formed to have a thickness of less than about 600 Angstroms.

Figure 5:
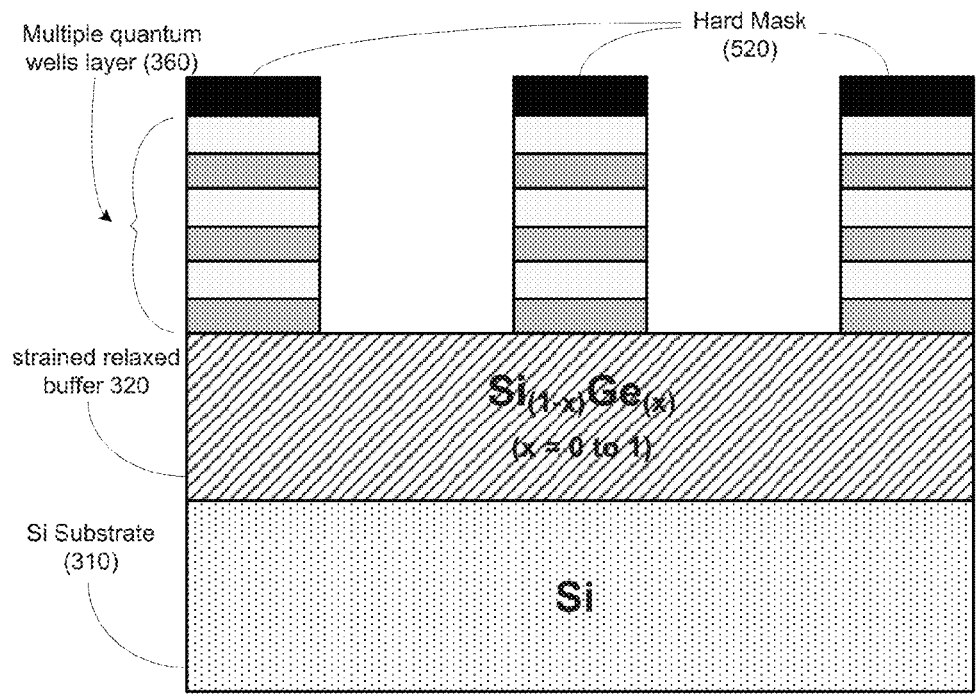
FIG. 5 illustrates a stylized cross-section depiction of a first processing step for fabricating a semiconductor device, in accordance with embodiments herein.

Turning now to FIGS. 5-10, a stylized cross-sectional depiction of an exemplary formation of a device on a quantum wells layer 360, in accordance with embodiments herein, is illustrated. FIG. 5 illustrates a strained relaxed buffer 320 that is formed over an Si substrate 310. Upon the strained relaxed buffer 320, a processed multiple quantum wells layer 360 comprising a plurality of strained silicon dominant layers 340 and strained germanium dominant layer 350. The use of a hard mask 520 leaves behind several formations of processed multiple quantum wells layers 360 that may be portions of a finFET device. The illustration of FIG. 5 may exemplify the result of a finFET photolithography process and a finFET etch process.

Figure 6:
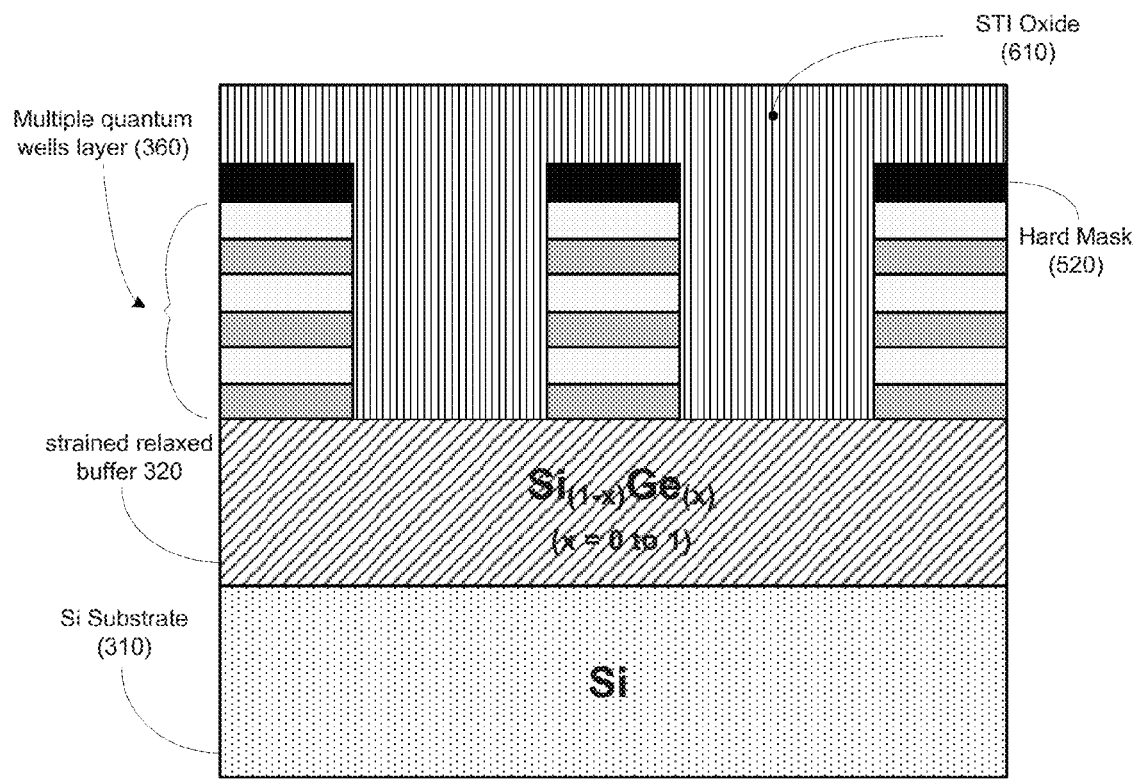
FIG. 6 illustrates a stylized cross-section depiction of a second processing step for fabricating a semiconductor device, in accordance with embodiments herein.
Figure 7:
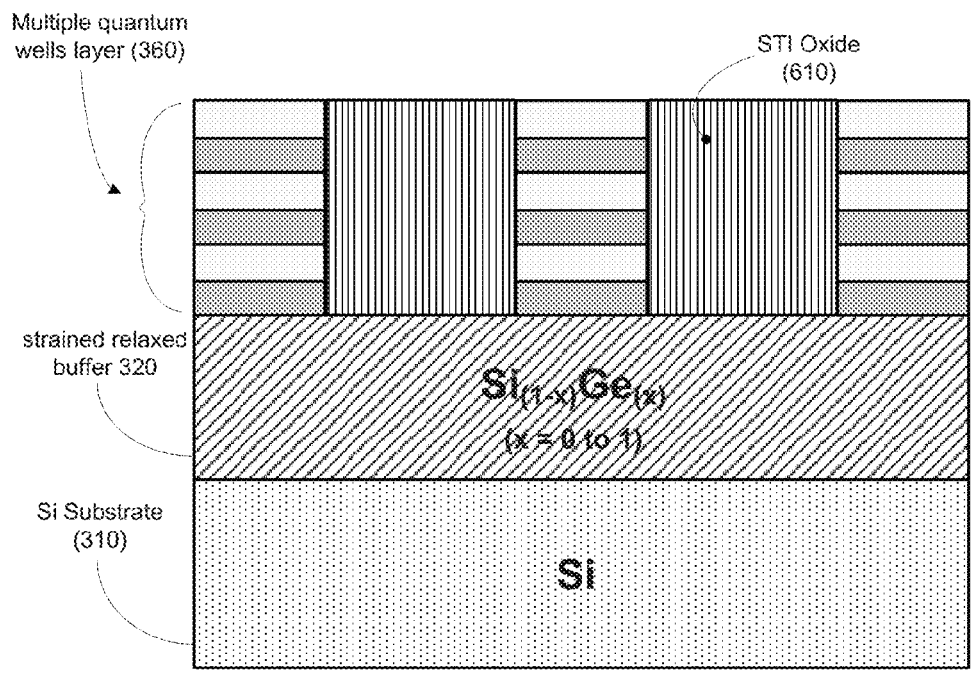
FIG. 7 illustrates a stylized cross-section depiction of a third processing step for fabricating a semiconductor device, in accordance with embodiments herein.
Figure 8:
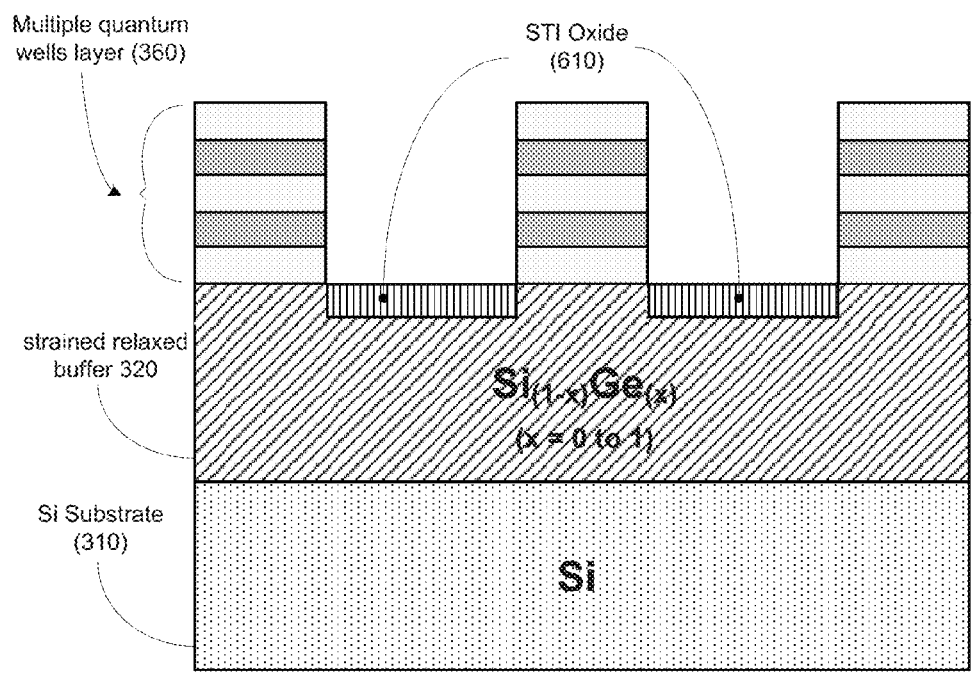
FIG. 8 illustrates a stylized cross-section depiction of a fourth processing step for fabricating a semiconductor device, in accordance with embodiments herein.

Subsequently, as illustrated in FIG. 6, a shallow trench isolation (STI) oxide layer 610 may be added to the finFET formations by performing an STI oxide deposition process. After the STI oxide deposition process, one or more etch processes may be performed (e.g., fin reveal etch process and hard mask (HM) etch process), as indicated in FIG. 7. The excess STI oxide and the hard mask may be removed by these etch processes (FIG. 8).

Figure 9:
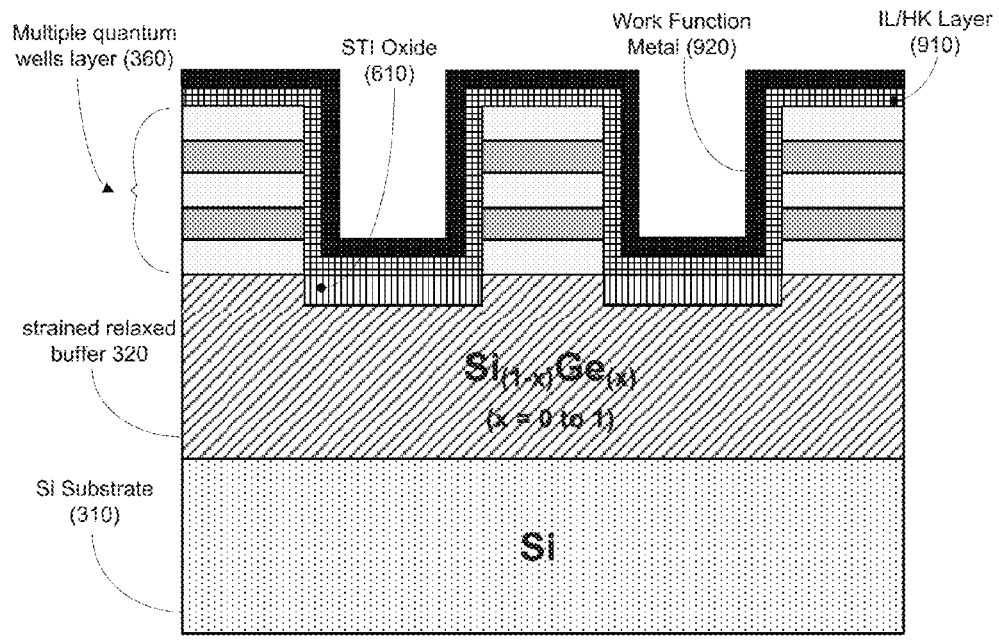
FIG. 9 illustrates a stylized cross-section depiction of a fifth processing step for fabricating a semiconductor device, in accordance with embodiments herein.
Figure 10:
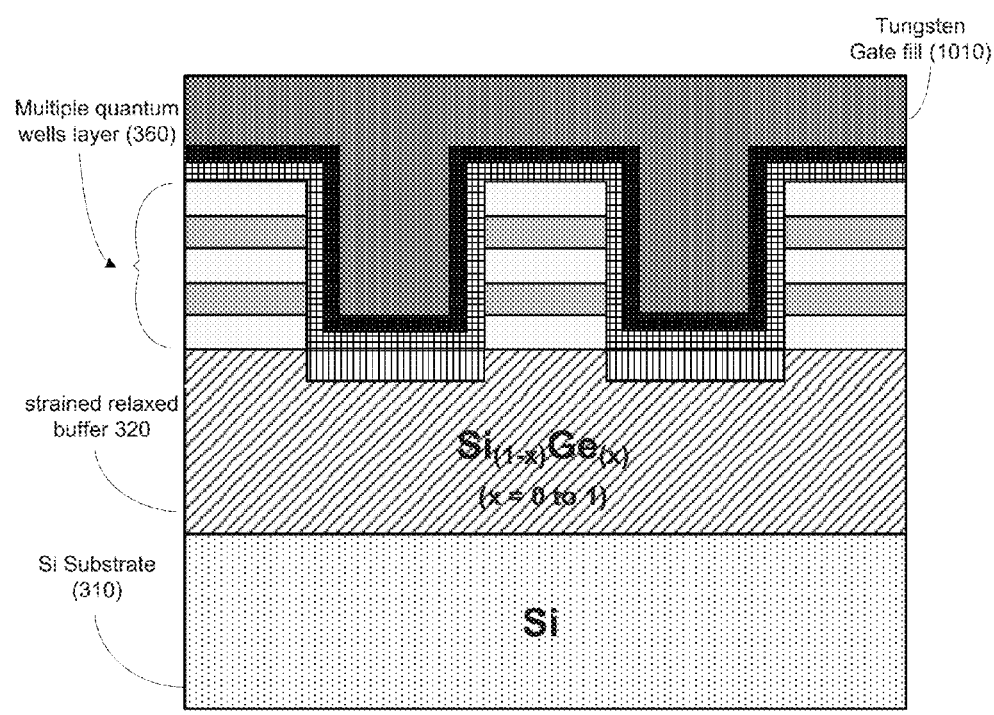
FIG. 10 illustrates a stylized cross-section depiction of a sixth processing step for fabricating a semiconductor device, in accordance with embodiments herein.

Referring to FIG. 9, an interface layer/high-k layer 910 may be formed by performing an interface oxide layer formation process and a high-k deposition process. Subsequently, a work function metal deposition may be performed to deposit a work function metal layer 920, as shown in FIG. 9. As shown in FIG. 10, a tungsten gate fill process may be performed. This process may be followed by a W-deposition process, a W-CMP process, a gate lithography process and a gate etch process. Those skilled in the art would appreciate that although a high-k metal-gate (HK/MG) gate-first process is exemplified herein, embodiments herein may be applied to gate-last processes also. Moreover, further processing steps, e.g., source/drain (S/D) formation, silicide process, back-end-of-line (BEOL) may be performed to form MOSFET devices using FinFET processes. The drain and source regions for an NMOS device may be formed from n-doped silicon or low germanium percentage SiGe material. The drain and source regions for a PMOS device may be formed from p-doped germanium or high germanium percentage SiGe material. Accordingly, the quantum wells layers 360 exemplified herein may provide for forming N-FET and/or P-FET devices using the same semiconductor base structure.

Figure 11:
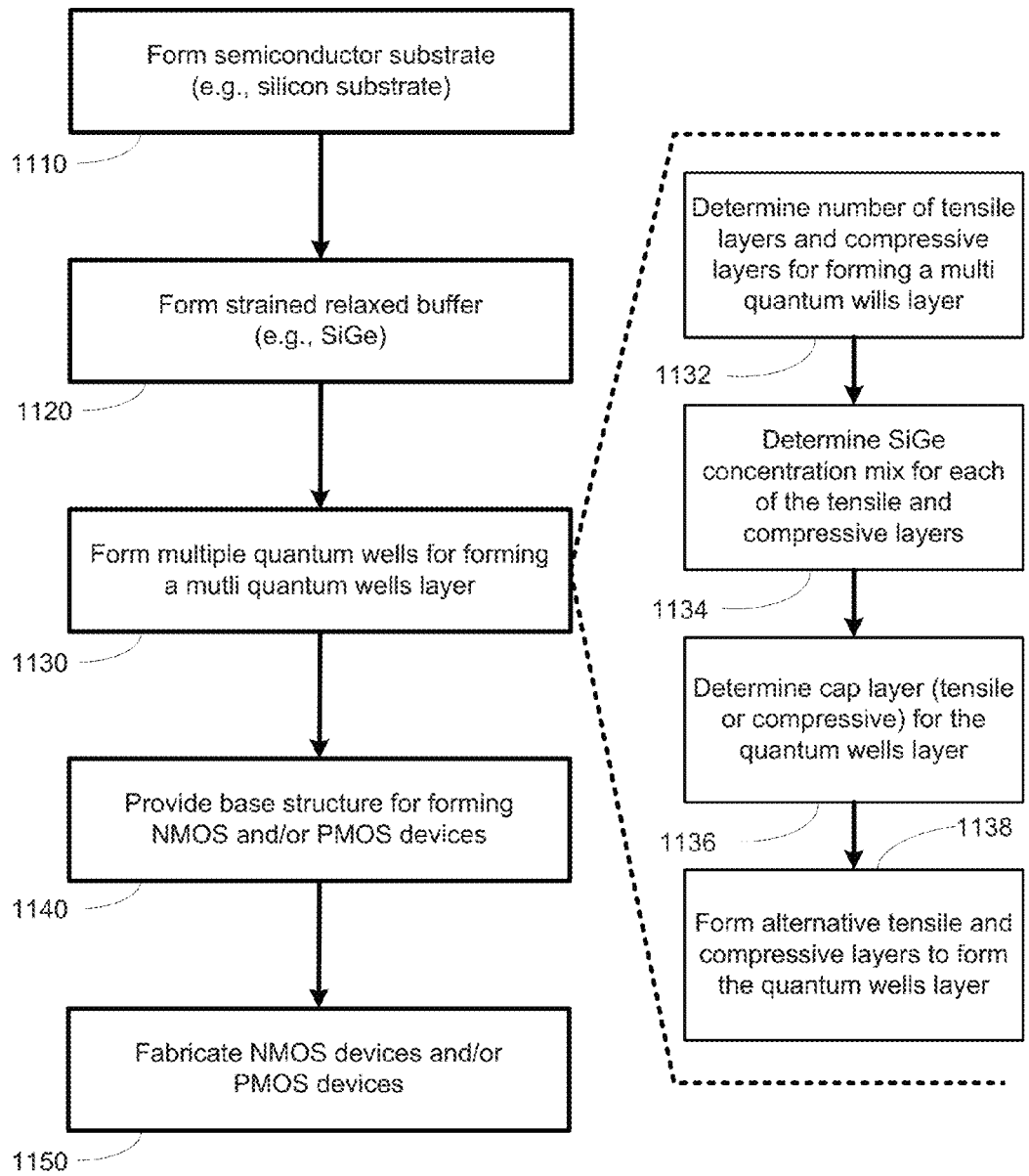
FIG. 11 illustrates a flowchart diagram of a method for fabricating a base structure comprising a quantum well layer, in accordance with embodiments herein.

Turning now to FIG. 11, a flowchart diagram of a method for fabricating a base structure comprising a quantum well layer, in accordance with embodiments herein is illustrated. A silicon substrate may be formed (block 1110). Upon the silicon substrate, a strained relaxed buffer may be formed (block 1120). In one embodiment, the strained relaxed buffer may comprise an equal concentration of silicon and germanium, e.g., $SiO_{0.5}Ge_{0.5}$. The thickness (e.g., 0.1 um to 5 um) of the strained relaxed buffer may also affect the characteristic of the strain-relaxation parameters.

A plurality of quantum wells may be fabricated to form a quantum wells layer on the strained relaxed buffer layer (block 1130). The forming of the quantum wells may comprise determining a number of tensile and compressive layers to form on the strained relaxed buffer (block 1132). This determination may depend on whether the devices to be formed on the base structure will be predominantly NMOS devices, PMOS devices, or a mixture of both. If the devices formed on the on the base structure will be predominantly NMOS devices, the cap layer of the quantum wells layer may be a tensile strain layer (block 1134). If the devices formed on the on the base structure will be predominantly PMOS devices, the cap layer of the quantum wells layer may be a compressive strain layer. A determination may be made as to the concentration of the silicon and germanium of each of the tensile and compressive layers (block 1136). Based upon these determinations, a plurality of tensile and compressive layers may be fabricated to form the quantum wells layer on the substrate (block 1138). In one embodiment, the quantum wells layer may have a thickness of about 60 A to about 600 A. Upon fabricating the quantum wells layer, a base structure is provided for forming NMOS and/or PMOS devices (block 1140). A plurality of NMOS and/or PMOS devices may then be formed on the base structure (block 1150).

Figure 12:
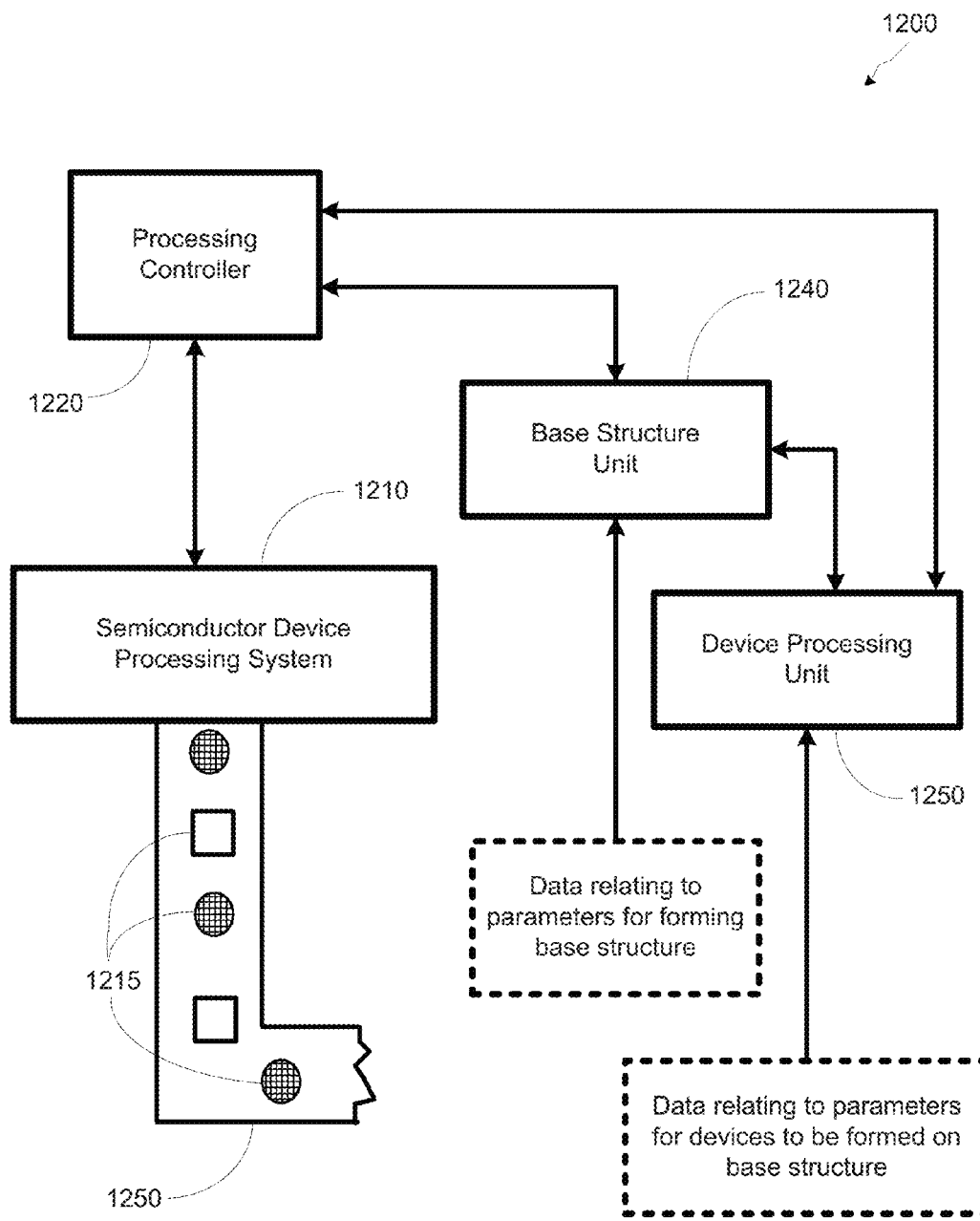
FIG. 12 illustrates a stylized depiction of a system for fabricating a semiconductor device comprising base structure that includes a quantum well layer, in accordance with embodiments herein.

Turning now to FIG. 12, a stylized depiction of a system for fabricating a semiconductor device package comprising a topside interconnection substrate, in accordance with embodiments herein, is illustrated. The system 1200 of FIG. 12 may comprise a semiconductor device processing system 1210 and an integrated circuit design unit 1240. The semiconductor device processing system 1210 may manufacture integrated circuit devices based upon one or more designs base structure unit and/or the device process unit 1260.

The semiconductor device processing system 1210 may comprise various processing stations, such as etch process stations, photolithography process stations, CMP process stations, etc. One or more of the processing steps performed by the processing system 1210 may be controlled by the processing controller 1220. The processing controller 1220 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1210 may produce integrated circuits on a medium, such as silicon wafers. The production of integrated circuits by the device processing system 1210 may be based upon the circuit designs provided by the integrated circuits design unit 1240. The processing system 1210 may provide processed integrated circuits/devices 1215 on a transport mechanism 1250, such as a conveyor system. In some embodiments, the conveyor system may be sophisticated clean room transport systems that are capable of transporting semiconductor wafers. In one embodiment, the semiconductor device processing system 1210 may comprise a plurality of processing steps, e.g., the $1^{st}$ process step, the $2^{nd}$ process set, etc., as described above.

In some embodiments, the items labeled "1215" may represent individual wafers, and in other embodiments, the items 1215 may represent a group of semiconductor wafers, e.g., a "lot" of semiconductor wafers. The integrated circuit or device 1215 may be a transistor, a capacitor, a resistor, a memory cell, a processor, and/or the like. In one embodiment, the device 1215 is a transistor and the dielectric layer is a gate insulation layer for the transistor.

The base structure unit 1240 may provide for designing base structure comprising a quantum well layer described herein. In one embodiment, based upon predetermined parameters defining the base structure (e.g., dimensions of the substrate layer, dimensions of parameters relating to the strained relaxed buffer, dimensions of parameter relating to the strain and compressive layers of the quantum well layer, etc.), manufacturing data comprising the parameters may be automatically created and provided to the processing controller 1220 for fabricating the base structure. The parameters relating to the base structure may be provided automatically by a computing device, or alternatively, manually by a user via a graphical user interface (GUI).

Further, base structure information, along with data relating to parameters for processing a device on the base structure may be provided to the device processing unit 1260. The device processing unit 1260 may automatically generate data for fabricating integrated circuit devices on the base structure. This data may be provided to the processing controller 1220 for manufacturing integrated circuit devices using the base structure.

The system 1200 may be capable of performing analysis and manufacturing of various products involving various technologies. For example, the system 1200 may receive design and production data for manufacturing devices of CMOS technology, Flash technology, BiCMOS technology, power devices, memory devices (e.g., DRAM devices), NAND memory devices, and/or various other semiconductor technologies.

The system 1200 may be capable of manufacturing and testing various products that include transistors with active and inactive gates involving various technologies. For example, the system 1200 may provide for manufacturing and testing products relating to CMOS technology, Flash technology, BiCMOS technology, power devices, memory devices (e.g., DRAM devices), NAND memory devices, and/or various other semiconductor technologies.

The methods described above may be governed by instructions that are stored in a non-transitory computer readable storage medium and that are executed by, e.g., a processor in a computing device. Each of the operations described herein (e.g., FIGS. 11 and 12) may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method for providing a semiconductor base structure, comprising:
   forming a substrate;
   forming a strained relaxed layer on said substrate;
   forming a first tensile strained layer on said strained relaxed layer;
   forming a first compressive strain layer on said first tensile strained layer;
   forming a second tensile strained layer above said first compressive strain layer; and
   forming a second compressive strain layer above said second tensile strained layer.

2. The method of claim 1, further comprising:
   determining whether an NMOS device or a PMOS is to be formed on said base structure;
   forming a third tensile strained layer above said second compressive strain layer in response to determining that an NMOS device is to be formed on said base structure.

3. The method of claim 1, further comprising forming at least one of an NMOS device and a PMOS device on said semiconductor base structure.

4. The method of claim 1, wherein forming a strained relaxed layer on said substrate comprises forming a layer comprising silicon at a first concentration and germanium at a second concentration.

5. The method of claim 1, wherein forming said first tensile strained layer comprises forming a layer comprising silicon at a first concentration and germanium at a second concentration, wherein said first concentration is greater than said second concentration.

6. The method of claim 5, further comprising adjusting at least one of said first and second concentrations for adjusting the electron mobility of said first tensile strained layer.

7. The method of claim 1, wherein forming said first compressive strain layer comprises comprising silicon at a first concentration and germanium at a second concentration, wherein said second concentration is greater than said first concentration.

8. The method of claim 7, further comprising adjusting at least one of said first and second concentrations for adjusting the hole mobility of said first compressive strained layer.

9. The method of claim 1, wherein:
   forming said strained relaxed layer comprises forming said strained relaxed layer having a thickness of about 0.1 micron to about 5 microns;
   forming said first tensile strained layer comprises forming said first tensile strained layer having a thickness of about 60 Angstroms to about 600 Angstroms; and
   forming said first compressive strain layer comprises forming said first compressive strain layer having a thickness of about 60 Angstroms to about 600 Angstroms.

10. The method of claim 1, wherein further comprising at least one of:
    forming an N-channel MOSFET on said base substrate;
    forming an N-channel finFET on said base substrate;
    forming a P-channel MOSFET on said base substrate; or
    forming a P-channel finFET on said base substrate.

11. A semiconductor device, comprising:
    a silicon substrate;
    a strained relaxed layer positioned on said silicon substrate; and
    a quantum well layer positioned on said strained relaxed layer, wherein said quantum well layer comprising a tensile strained layer positioned on said strained relaxed layer, and a compressive strain layer on said tensile strained layer; and
    wherein said semiconductor base substrate is capable of providing an enhanced current drive for at least one of a NMOS device and a PMOS device formed on said quantum well layer.

12. The semiconductor device of claim 11, wherein said quantum well layer comprises a plurality of tensile strained layers and a plurality of compressive strain layers, wherein said tensile strained layers are formed alternating with said compressive strain layers.

13. The semiconductor device of claim 11, wherein said NMOS device is at least one of an N-channel MOSFET or an N-channel finFET; and wherein said PMOS device is at least one of a P-channel MOSFET or a P-channel finFET.

14. The semiconductor device of claim 11, wherein said strained relaxed layer on said substrate comprises silicon and germanium at equal concentrations.

15. The semiconductor device of claim 11, wherein said tensile strained layer comprises silicon at a first concentration and germanium at a second concentration, wherein said first concentration is greater than said second concentration.

16. The semiconductor device of claim 11, wherein said compressive strain layer comprises silicon at a first concentration and germanium at a second concentration, wherein said second concentration is greater than said first concentration.

17. A system, comprising:
a semiconductor device processing system to provide an integrated circuit device, wherein said integrated circuit device comprises:
  a silicon substrate;
  a strained relaxed layer positioned on said silicon substrate; and
  a quantum well layer positioned on said strained relaxed layer wherein said quantum well layer comprising a tensile strained layer positioned on said strained relaxed layer, and a compressive strain layer on said tensile strained layer; and
  wherein said semiconductor base substrate is capable of providing an increased current drive for at least one of a NMOS device and a PMOS device formed on said quantum well layer; and
a processing controller operatively coupled to said semiconductor device processing system, said processing controller configured to control an operation of said semiconductor device processing system.

18. The system of claim 17, further comprising a base structure unit for providing data comprising a plurality of parameters for fabricating said integrated circuit device.

19. The system of claim 17, wherein:
said quantum well layer comprises a plurality of tensile strained layers and a plurality of compressive strain layers, wherein said tensile strained layers are formed alternating with said compressive strain layers; and
said NMOS device is at least one of an N-channel MOSFET or an N-channel finFET; and wherein said PMOS device is at least one of a P-channel MOSFET or a P-channel finFET.

* * * * *